United States Patent
Harada

(10) Patent No.: US 9,530,707 B2
(45) Date of Patent: Dec. 27, 2016

(54) SEMICONDUCTOR MODULE

(71) Applicant: FUJI ELECTRIC CO., LTD., Kawasaki-shi, Kanagawa (JP)

(72) Inventor: Takahito Harada, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/877,389

(22) Filed: Oct. 7, 2015

(65) Prior Publication Data

US 2016/0027711 A1 Jan. 28, 2016

Related U.S. Application Data

(63) Continuation of application No. PCT/JP2014/072827, filed on Aug. 29, 2014.

(30) Foreign Application Priority Data

Oct. 3, 2013 (JP) .................................. 2013-207878

(51) Int. Cl.
*H01L 25/065* (2006.01)
*H01L 23/053* (2006.01)
(Continued)

(52) U.S. Cl.
CPC ........... *H01L 23/053* (2013.01); *H01L 23/051* (2013.01); *H01L 23/367* (2013.01); (Continued)

(58) Field of Classification Search
CPC .... H01L 25/043; H01L 25/071; H01L 25/074; H01L 25/0756; H01L 25/0657
(Continued)

(56) References Cited

U.S. PATENT DOCUMENTS 5,923,084 A 7/1999 Inoue et al.
6,262,474 B1 7/2001 Kobayashi et al.
(Continued)

FOREIGN PATENT DOCUMENTS

JP S63-283147 A 11/1988
JP H09-055459 A 2/1997
(Continued)

OTHER PUBLICATIONS

PCT, "International Search Report for International Application No. PCT/JP2014/072827".

*Primary Examiner* — Cuong Q Nguyen
(74) *Attorney, Agent, or Firm* — Manabu Kanesaka

(57) ABSTRACT

A semiconductor module includes a printed circuit board having an insulating plate, first and fourth wiring layers disposed on a principal surface of the insulating plate, second and third wiring layers disposed on another surface opposite to the principal surface, a first via disposed in the insulating plate and electrically and mechanically connected to the first and third wiring layers, and a second via disposed in the insulating plate and electrically and mechanically connected to the second and fourth wiring layers; a first insulating substrate disposed with a first circuit plate; a second insulating substrate disposed with a second circuit plate; a first semiconductor chip; a second semiconductor chip; a first heat release member fixed between the third wiring layer and the third circuit plate; and a second heat release member fixed between the fourth wiring layer and the first circuit plate.

10 Claims, 16 Drawing Sheets

(51) Int. Cl.
  *H01L 25/07*   (2006.01)
  *H01L 23/051*  (2006.01)
  *H01L 23/498*  (2006.01)
  *H01L 23/367*  (2006.01)
  *H01L 23/373*  (2006.01)
  *H01L 23/433*  (2006.01)
  *H01L 23/492*  (2006.01)
  *H01L 23/00*   (2006.01)
  *H01L 23/31*   (2006.01)
  *H01L 21/48*   (2006.01)
  *H01L 23/538*  (2006.01)

(52) U.S. Cl.
  CPC ...... *H01L 23/3675* (2013.01); *H01L 23/3735* (2013.01); *H01L 23/4334* (2013.01); *H01L 23/492* (2013.01); *H01L 23/49811* (2013.01); *H01L 23/49822* (2013.01); *H01L 23/49827* (2013.01); *H01L 23/49833* (2013.01); *H01L 23/49838* (2013.01); *H01L 24/33* (2013.01); *H01L 25/0657* (2013.01); *H01L 25/07* (2013.01); *H01L 21/486* (2013.01); *H01L 23/3107* (2013.01); *H01L 23/5384* (2013.01); *H01L 23/5385* (2013.01); *H01L 2224/32225* (2013.01); *H01L 2224/33181* (2013.01); *H01L 2224/48091* (2013.01); *H01L 2224/48227* (2013.01); *H01L 2224/73265* (2013.01); *H01L 2225/06555* (2013.01); *H01L 2225/06572* (2013.01); *H01L 2225/06589* (2013.01); *H01L 2924/13055* (2013.01); *H01L 2924/13091* (2013.01); *H01L 2924/19107* (2013.01)

(58) Field of Classification Search
  USPC .................................................. 257/686, 777
  See application file for complete search history.

(56) References Cited

U.S. PATENT DOCUMENTS

| 6,642,576 | B1  |   | 11/2003 | Shirasawa et al. |
| 8,975,711 | B2  | * | 3/2015  | Otremba ............... H01L 25/071 |
|           |     |   |         | 257/401 |
| 2008/0258293 | A1 |   | 10/2008 | Yang et al. |
| 2009/0116197 | A1 |   | 5/2009  | Funakoshi et al. |
| 2009/0302444 | A1 |   | 12/2009 | Ueda et al. |

FOREIGN PATENT DOCUMENTS

| JP | H11-345926 | A | 12/1999 |
| JP | 2000-101018 | A | 4/2000 |
| JP | 2004-047850 | A | 2/2004 |
| JP | 2005-303018 | A | 10/2005 |
| JP | 2006-134990 | A | 5/2006 |
| JP | 2007-012685 | A | 1/2007 |
| JP | 2008-010768 | A | 1/2008 |
| JP | 2008-270810 | A | 11/2008 |
| JP | 2009-117428 | A | 5/2009 |
| JP | 2009-295794 | A | 12/2009 |
| JP | 2010-267685 | A | 11/2010 |
| JP | 2011-086821 | A | 4/2011 |
| JP | 2013-058645 | A | 3/2013 |

* cited by examiner

FIG. 3(a)
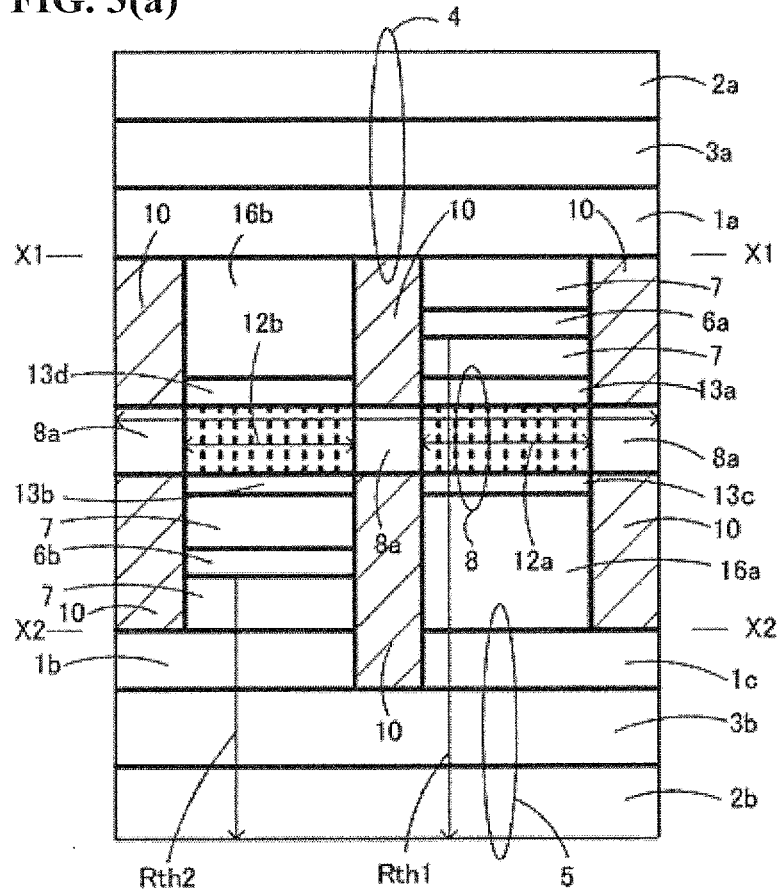
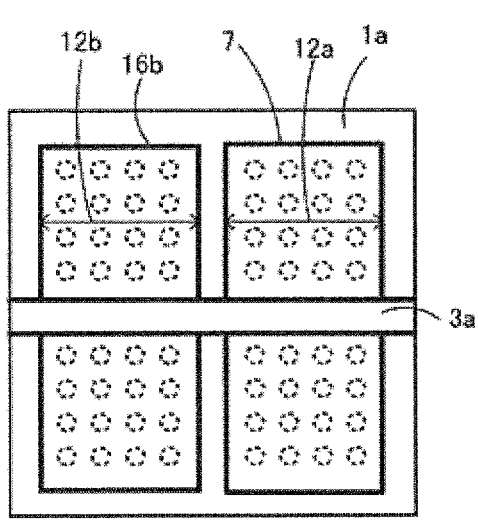
FIG. 3(b)
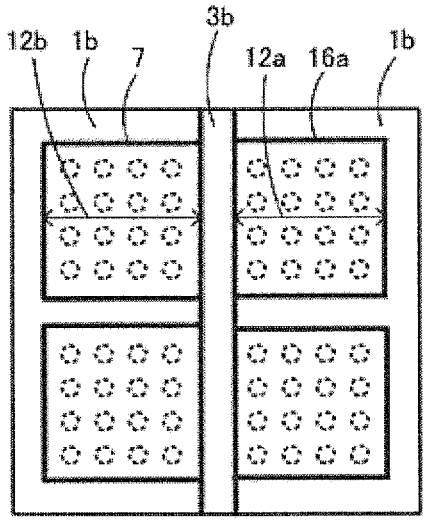
FIG. 3(c)

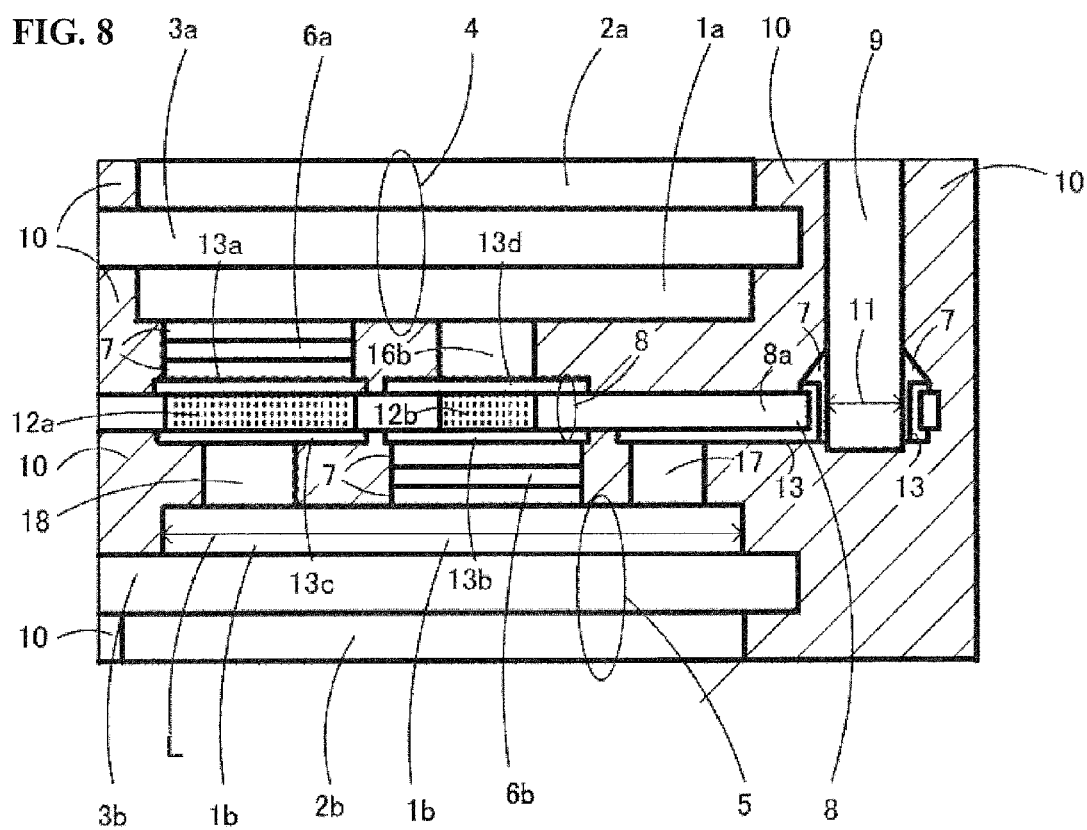

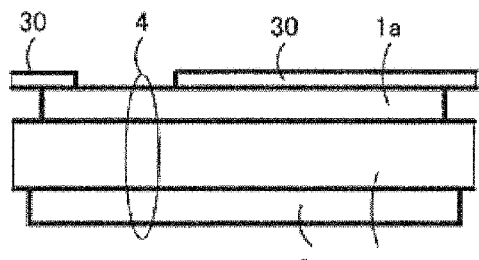 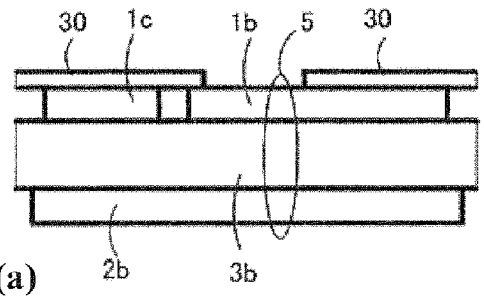
FIG. 9(a)
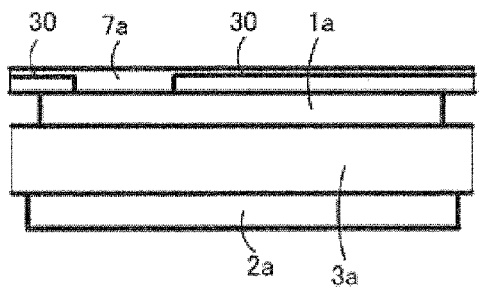 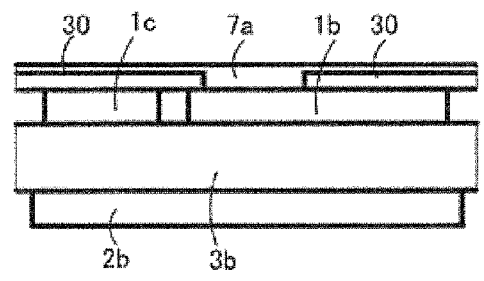
FIG. 9(b)
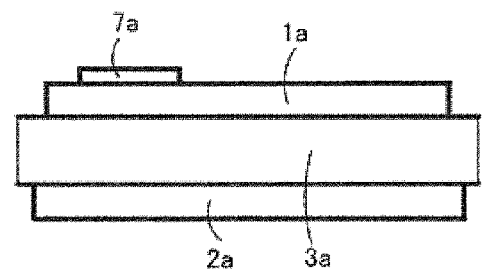 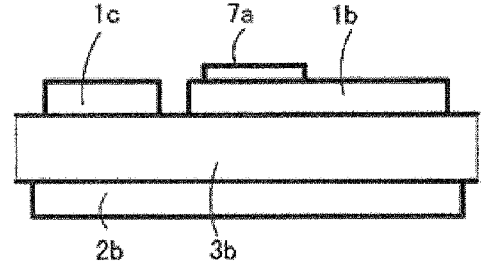
FIG. 9(c)
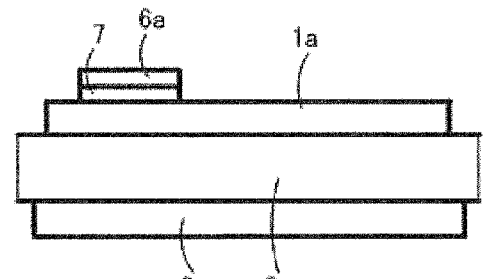 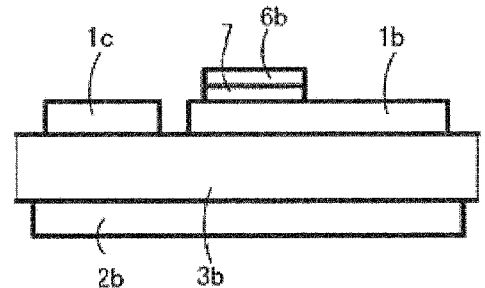
FIG. 9(d)

Prior Art

SEMICONDUCTOR MODULE

CROSS-REFERENCES TO RELATED APPLICATIONS

The present application is a Continuation application of PCT International Application No. PCT/JP2014/072827 filed Aug. 29, 2014, claiming priority from Japanese Application No. 2013-207878 filed Oct. 3, 2013, the disclosure of which is incorporated herein.

TECHNICAL FIELD

The present invention relates to a semiconductor module.

BACKGROUND ART

FIG. 16 is a structural diagram of a common heretofore known semiconductor module 500 described in PTL 1. The semiconductor module 500 includes an insulating substrate 54, a semiconductor chip 56, a base plate 57, a resin case 59, metal wires 60, a gel 61, and a cover 62.

The insulating substrate 54 is formed from a ceramic plate 51, circuit plates 52 disposed on the front surface of the ceramic plate 51, and a metal plate 53 disposed on the rear surface. Further, the semiconductor chip 56 is joined to the top of the circuit plate 52 by a solder 55. Also, the metal base plate 57 is joined to the metal plate 53 via a solder 55. The resin case 59 is attached to the outer periphery of the base plate 57, and external terminals 58 are insert molded. The semiconductor chip 56 and the external terminals 58 are electrically connected by the metal wires 60. The inside of the resin case 59 is filled with the gel 61 which is an insulating seal material. The resin cover 62 is firmly fixed to an upper portion of the resin case 59. Further, cooling fins (not shown) are mounted to the base plate 57.

Heat generated in the semiconductor chip 56 is released to the cooling fins via the insulating substrate 54 and base plate 57. The semiconductor module 500 is a single-sided cooling semiconductor device.

CITATION LIST

Patent Literature

PTL 1: JP-A-2010-267685

SUMMARY OF INVENTION

Technical Problem

The heretofore known semiconductor module 500 shown in FIG. 16 has the kinds of problems described below.

(1) As the circuit plate 52 is connected to one surface of the ceramic plate 51, the area of the insulating substrate 54 increases.

(2) As one portion of wiring of an electrical circuit is carried out on the circuit plate 52, it is necessary to change the pattern of the circuit plates 52 when changing the structure of the electrical circuit, and an assembly jig for the insulating substrate 54, a metal mask, or the like, is required to be changed each time.

(3) As one portion of wiring of the electrical circuit is carried out using the metal wires 60, batch processing cannot be performed, leading to an increase in process time, thus requiring many processing devices.

(4) As wiring of the electrical circuit is carried out using the metal wires 60 and external terminals 58, it is necessary to change the shape of the external terminals 58 when forming a different electrical circuit, and a mold is required each time the external terminals 58 are processed.

(5) The number of components (the metal wires 60, the resin case 59, the cover 62, the gel 61, and the like) is large, leading to an increase in manufacturing cost.

(6) As the electrical circuit is formed from the metal wires 60, circuit plate 52, and external terminals 58, and the distance between the metal wires and the circuit plates facing thereto is large, wiring inductance increases.

An object of the invention is to provide a semiconductor module which, by solving the previously described problems, can achieve a reduction in thermal resistance, a reduction in wiring inductance, a securement of a ground insulation distance, a simplification of a circuit configuration, a reduction in the number of processes required for a connection and junction of components, a reduction in cost, and a reduction in size.

Solution to Problem

In order to achieve the previously described object, in one aspect of the invention, a semiconductor module includes a printed circuit board having an insulating plate, a first wiring layer and fourth wiring layer disposed on a principal surface of the insulating plate, a second wiring layer and third wiring layer disposed on a surface on the opposite side to the principal surface, a first via, disposed in the insulating plate, which is electrically and mechanically connected to the first wiring layer and third wiring layer, and a second via, disposed in the insulating plate, which is electrically and mechanically connected to the second wiring layer and fourth wiring layer; a first insulating substrate, disposed facing the first wiring layer, on a surface of which facing the first wiring layer and fourth wiring layer is disposed a first circuit plate; a second insulating substrate, disposed facing the second wiring layer, on which are disposed a second circuit plate facing the second wiring layer and a third circuit plate facing the third wiring layer; a first semiconductor chip, sandwiched between the first wiring layer and the first circuit plate, two opposed surfaces being fixed to the first wiring layer and first circuit plate by a conductive joining material, respectively; a second semiconductor chip, sandwiched between the second wiring layer and the second circuit plate, two opposed surfaces being fixed to the second wiring layer and second circuit plate by a conductive joining material, respectively; a first heat release member which is fixed and sandwiched between the third wiring layer and the third circuit plate; and a second heat release member which is fixed and sandwiched between the fourth wiring layer and the first circuit plate.

Advantageous Effects of Invention

According to the invention, it is possible to provide a semiconductor module which can achieve a reduction in thermal resistance, a reduction in wiring inductance, a securement of a ground insulation distance, a simplification of a circuit configuration, a reduction in the number of processes required for a connection and junction of components, a reduction in cost, and a reduction in size.

BRIEF DESCRIPTION OF DRAWINGS

FIGS. 3(a)-3(c) are structural diagrams used to calculate a relationship between a thermal resistance Rth1 of a first semiconductor chip 6a and a filled rate of a first via 12a.

FIGS. 4(a), 4(b) are structural diagrams of the first via 12a.

FIGS. 5(a), 5(b) are diagrams showing a relationship between the thermal resistance Rth1 and the filled rate of the first via 12a.

FIG. 8 is a sectional view showing a modified example of the first embodiment.

FIGS. 9(a)-9(d) are sectional views illustrating a manufacturing process of a semiconductor module 100 according to a second embodiment.

DESCRIPTION OF EMBODIMENTS

A detailed description will be given using an embodiment. Expressions "upper" and "lower" corresponding to the descriptions of the drawings are used below for ease of description, but the embodiments, not being limited to the described embodiment, can be modified into various forms without departing from the scope of the technical idea of the invention. Also, "electrically and mechanically connected" includes not only a case in which objects are connected together by direct junction, but also a case in which objects are connected together via a conductive joining material such as a solder or a metal sintered material, and the same applies to the following description.

Figure 1:
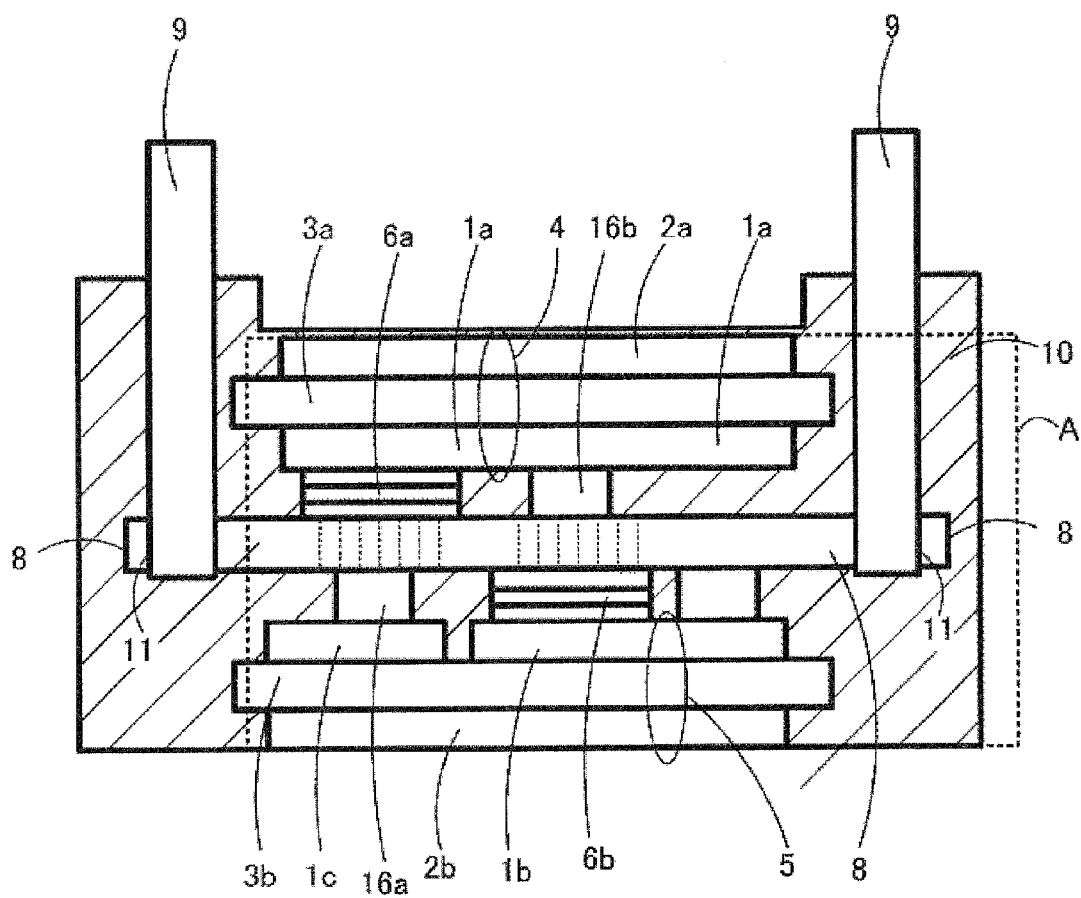
FIG. 1 is a sectional view of a semiconductor module 100 according to a first embodiment.
Figure 2:
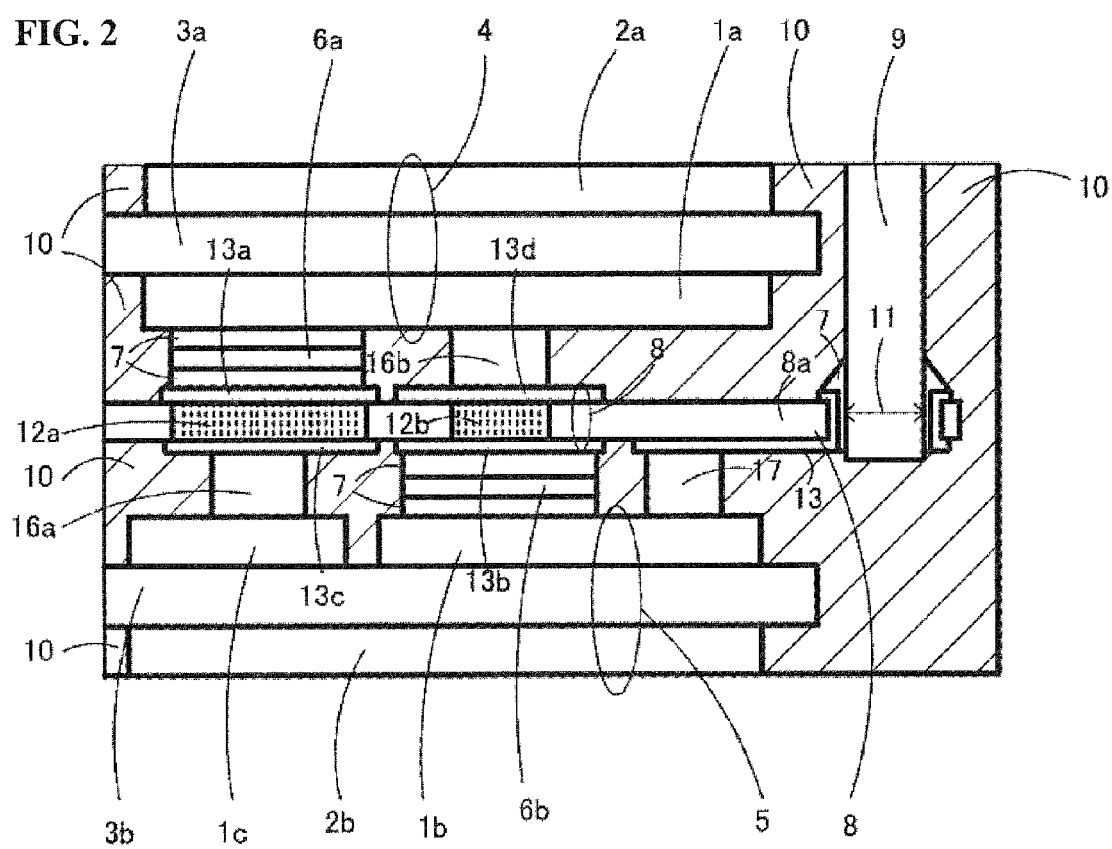
FIG. 2 is an enlarged view of the portion A in FIG. 1.

FIG. 1 is a sectional view of a semiconductor module 100 of a first embodiment according to the invention. FIG. 2 is an enlarged view of the portion A in FIG. 1. The semiconductor module 100 includes a printed circuit board 8, a first insulting substrate 4, a second insulating substrate 5, a first semiconductor chip 6a, a second semiconductor chip 6b, a first heat release member 16a, and a second heat release member 16b. Furthermore, the semiconductor module 100 is a semiconductor module which enables the first semiconductor chip 6a and the second semiconductor chip 6b to be electrically connected to an external circuit by external terminals 9. The first semiconductor chip 6a is an upper chip, and the second semiconductor chip 6b is a lower chip.

The printed circuit board 8 has an insulating plate 8a, a first wiring layer 13a, a second wiring layer 13b, a third wiring layer 13c, a fourth wiring layer 13d, a first via 12a, and a second via 12b. The first wiring layer 13a and the fourth wiring layer 13d are disposed on the principal surface of the insulating plate 8a, and the second wiring layer 13b and the third wiring layer 13c are disposed on a surface of the insulating plate 8a opposite to the principal surface. Further, the first wiring layer 13a and the third wiring layer 13c are electrically and mechanically connected by the first via 12a disposed in the insulating plate 8a. Also, the second wiring layer 13b and the fourth wiring layer 13d are electrically and mechanically connected by the second via 12b disposed in the insulating plate 8a. The first via 12a and the second via 12b are formed of conductors wherein a large number of minute through holes 20 are formed in the insulating plate 8a and are filled with metal such as Cu (copper) plating or the like. As the insulating plate 8a, there is, for example, a glass epoxy plate.

The first insulating substrate 4 is formed by stacking a first circuit plate 1a, a first ceramic plate 3a, and a first metal plate 2a. The first insulating plate 4 is disposed facing the principal surface of the printed circuit board 8. Furthermore, the first circuit plate 1a is disposed facing the first wiring layer 13a and fourth wiring layer 13d.

The second insulating substrate 5 is formed by stacking a second circuit plate 1b and third circuit plate 1c, a second ceramic plate 3b, and a second metal plate 2b. The second insulating substrate 5 is disposed facing the surface of the printed circuit board 8 opposite to the principal surface. Furthermore, the second circuit plate 1b is disposed facing the second wiring layer 13b, and the third circuit plate 1c is disposed facing the third wiring layer 13c.

The first ceramic plate 3a and the second ceramic plate 3b are formed from a high thermal conductive ceramic such as alumina, alumina nitride, or silicon nitride. Also, the first circuit plate 1a, the second circuit plate 1b, the third circuit plate 1c, the first meal plate 2a, and the second metal plate 2b are formed from a high thermal conductive metal such as copper or aluminum.

The first semiconductor chip 6a and the second semiconductor chip 6b are each formed from a power semiconductor element such as an IGBT (insulated gate bipolar transistor), a power MOSFET, or an FWD (free wheeling diode). The first semiconductor chip 6a and the second semiconductor chip 6b each include, on either of two opposed surfaces, electrodes such as an emitter electrode, a collector electrode, and a gate electrode (not shown).

The first semiconductor chip 6a is sandwiched between the first wiring layer 13a and the first circuit plate 1a, and the two opposed surfaces of the first semiconductor chip 6a are electrically and mechanically connected one to each of the first wiring layer 13a and first circuit plate 1a by a conductive joining material 7 such as a solder. By so doing, each of the first wiring layer 13a and the first circuit plate 1a is electrically connected to the electrodes on each surface of the first semiconductor chip 6a.

The second semiconductor chip 6b is sandwiched between the second wiring layer 13b and the second circuit plate 1b, and the two opposed surfaces of the second semiconductor chip 6b are electrically and mechanically connected to the second wiring layer 13b and second circuit plate 1b respectively by a conductive joining material 7 such as a solder. By so doing, the second wiring layer 13b and the second circuit plate 1b are electrically connected to the electrodes on each respective surface of the second semiconductor chip 6b.

The front and rear surfaces of each of the first semiconductor chip 6a and second semiconductor chip 6b are conductively plated (for example, metallically plated with Ti, Ni, Au, or the like) in order to enhance the good wettability of the joining material 7 such as a solder. A conductive adhesive, such as an Ag paste or a Cu paste, may be used as the joining material 7.

The first heat release member 16a and the second heat release member 16b are formed from metal. The first heat release member 16a is sandwiched between the third wiring layer 13c and the third circuit plate 1c, and two ends of the first heat release member 16a are electrically and mechanically connected to the third wiring layer 13c and third circuit plate 1c respectively. The second heat release member 16b is sandwiched between the fourth wiring layer 13d and the first circuit plate 1a, and two ends of the second heat release member 16b are electrically and mechanically connected to the fourth wiring layer 13d and first circuit plate 1a respectively. For example, a solder can be used for the first heat release member 16a and second heat release member 16b. In this case, as it is not necessary to prepare any separate joining materials, it is possible to reduce manufacturing cost. Also, a copper block or the like may be used for the first heat release member 16a and second heat release member 16b. In this case, it is possible to improve the heat releasing characteristics.

The semiconductor module 100 also includes the external terminals 9, joined via respective through vias 11 of the printed circuit board 8, which are electrically connected at least one of the first wiring layer 13a or second wiring layer 13b. Also, the semiconductor module 100 includes a sealing resin 10 which seals the whole so that the external terminals 9 and the second metal plate 2b are exposed, and which also functions as a housing. Also, the semiconductor module 100 includes a conductor 17 which electrically connects the printed circuit board 8 and second circuit plate 1b. The semiconductor module 100 is used as a single-sided cooling semiconductor device by installing unshown cooling fins on the exposed lower surface of the second metal plate 2b.

In the semiconductor module 100, the printed circuit board 8, the first insulating substrate 4, the second insulating substrate 5, and the external terminals 9 form a predetermined electrical circuit which is required for the semiconductor module 100.

The semiconductor module 100 is formed such that the first wiring layer 13a, on which the first semiconductor chip 6a is disposed, and the third wiring layer 13c, which faces the first wiring layer 13a with the insulating plate 8a sandwiched therebetween, are connected by the first via 12a. Further, the third wiring layer 13c and the third circuit plate 1c are connected by the first heat release member 16a. Therefore, as heat generated in the first semiconductor chip 6a is transferred not only to the first insulating substrate 4, but also to the second insulating substrate 5, it is possible to enhance heat releasing characteristics.

Furthermore, the semiconductor module 100 is formed such that the second wiring layer 13b, on which the second semiconductor chip 6b is disposed, and the fourth wiring layer 13d, which faces the second wiring layer 13b with the insulating plate 8a sandwiched therebetween, are connected by the second via 12b. Further, the fourth wiring layer 13d and the first circuit plate 1a are connected by the second heat release member 16b. Therefore, as heat generated in the second semiconductor chip 6b is transferred not only to the second insulating substrate 5, but also to the first insulating substrate 4, it is possible to enhance heat releasing characteristics.

With this structure, as the external terminals 9 protrude from the upper surface of the semiconductor module 100, it is possible to increase the creepage distance between the second metal plate 2b, which is the ground surface of the second insulating substrate 5, and the external terminals 9. Therefore, it is possible to sufficiently secure a ground insulation distance.

The third wiring layer 13c and the third circuit plate 1c are metal pads between which to join the first heat release member 16a in order to cause the heat of the first semiconductor chip 6a to flow to the cooling fins via the second insulating substrate 5. Therefore, the third wiring layer 13c and the third circuit plate 1c may not be used as electrical wirings. Also, in this case, the second wiring layer 13b and the third wiring layer 13c may be integrally formed.

FIGS. 3(a)-3(c) are structural diagrams of the vicinity of the first semiconductor chip 6a used to calculate a relationship between a thermal resistance Rth1 of the first semiconductor chip 6a and a filled rate of the first via 12a. FIG. 3(a) is a sectional view, FIG. 3(b) is a plan view taken along the line X1-X1 in FIG. 3(a), and FIG. 3(c) is a plan view taken along the line X2-X2 in FIG. 3(a). Herein, four vias are illustrated as shown in the plan views.

Heat generated in the first semiconductor chip 6a is transferred to the second insulating substrate 5 byway of the first via 12a of the printed circuit substrate 8, and released to the unshown cooling fins. Therefore, the thermal resistance Rth1 is determined based on the path of heat transfer from the first semiconductor chip 6a to the second metal plate 2b. Further, the thermal resistance Rth1 depends greatly on the structure of the first via 12a. Meanwhile, as heat generated in the second semiconductor chip 6b flows directly to the second metal plate 2b, a thermal resistance Rth2 does not depend on the structure of the via.

Figure 4A:
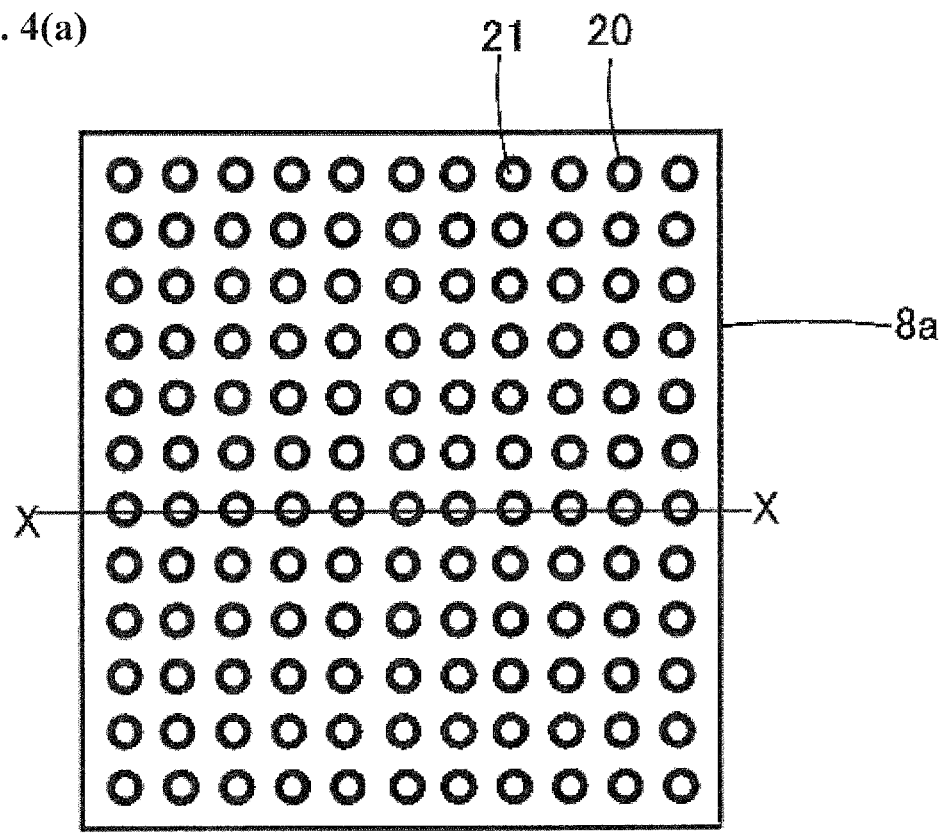
Figure 4B:
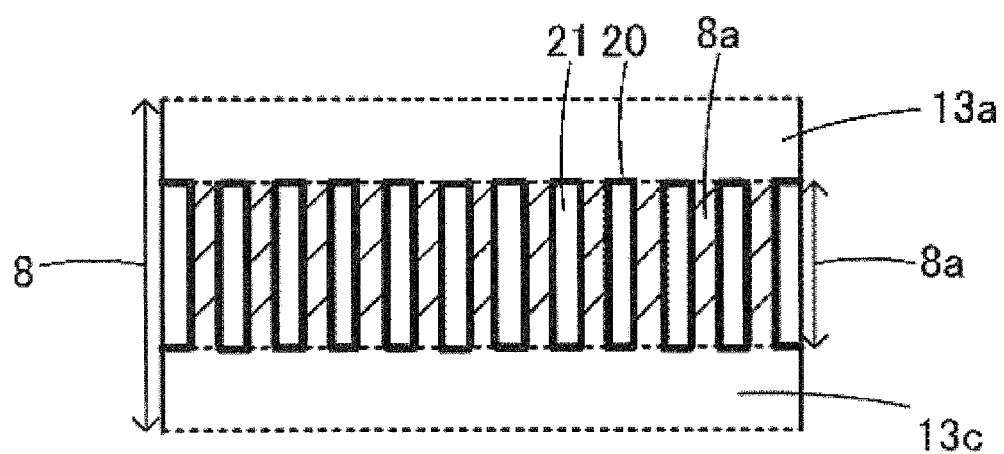

FIGS. 4(a), 4(b) are structural diagrams of the first via 12a, wherein FIG. 4(a) is a plan view, and FIG. 4(b) is a sectional view taken along the line X-X in FIG. 4(a).

The first via 12a has a structure wherein the large number of minute through holes 20 formed in the insulating plate 8a of the printed circuit board 8 are filled with metal, and thin columnar conductors 21 are aggregated. The case in which the shape in plan view of the through holes 20 is circular is illustrated here, but the shape, not being limited to this, may be polygonal or slit-like. In FIG. 4(b), the upper first wiring layer 13a and the lower third wiring layer 13c are shown by the dotted lines.

Figure 5A:
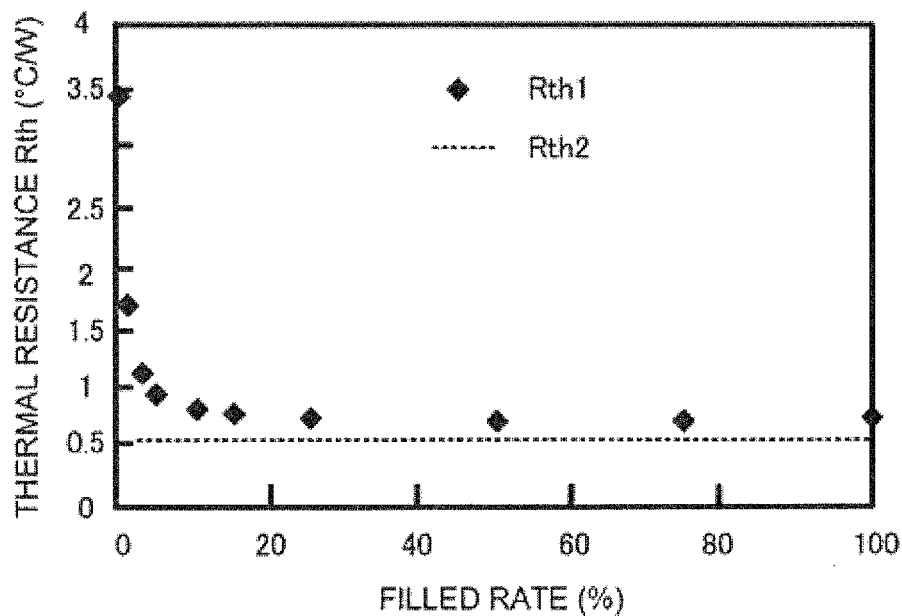
Figure 5B:
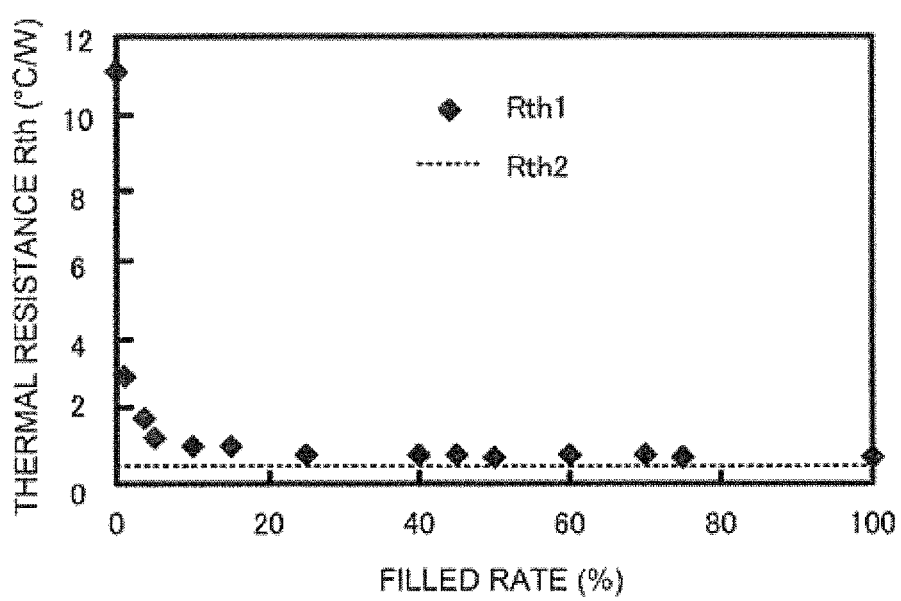
Figure 6A:
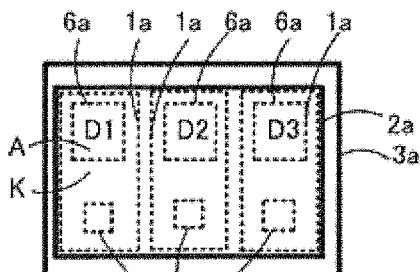
FIGS. 6(a)-6(e) are transparent plan views of individual parts of a diode module of the first embodiment.
Figure 6B:
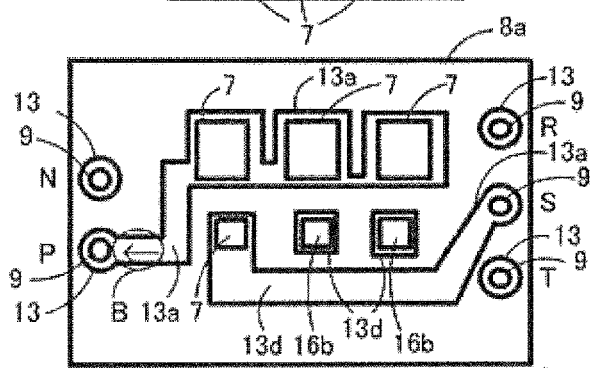
Figure 6C:
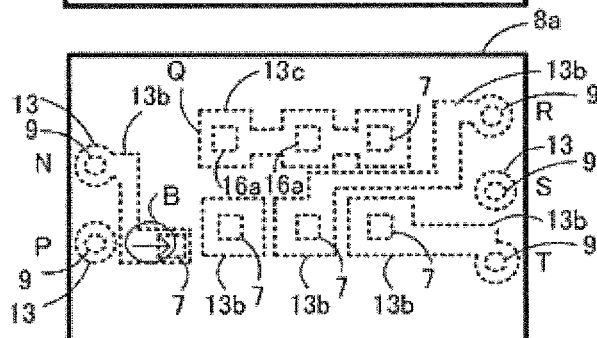
Figure 6D:
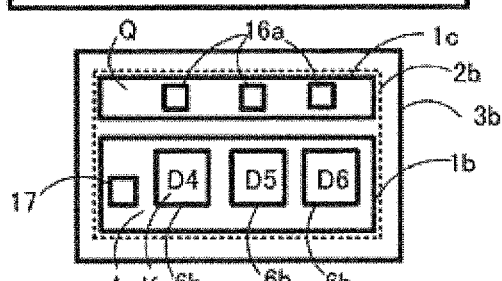
Figure 6E:
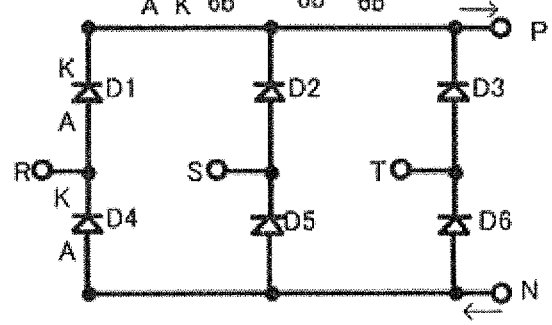
Figure 7A:
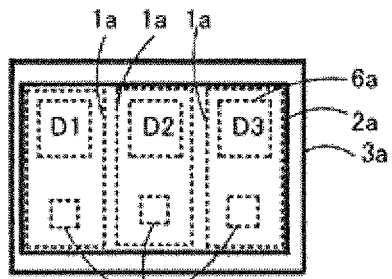
FIGS. 7(a)-7(e) are transparent plan views of individual parts of the diode module of the first embodiment.
Figure 7B:
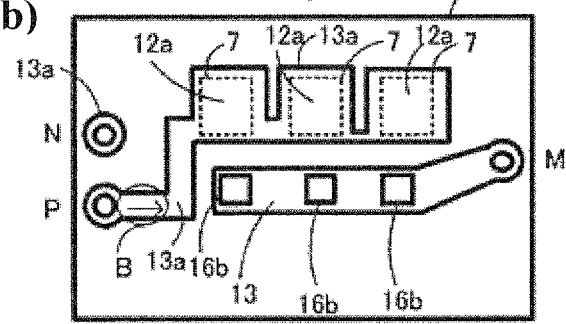
Figure 7C:
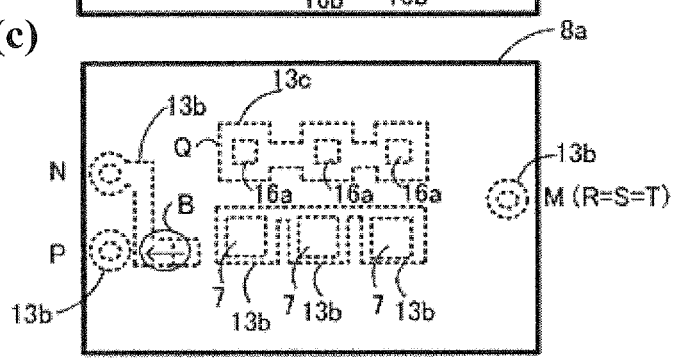
Figure 7D:
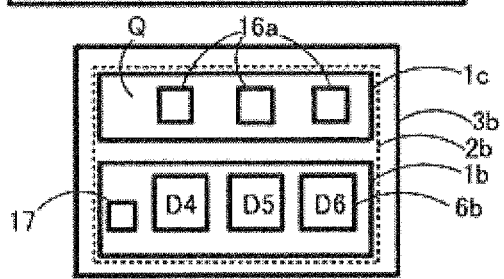
Figure 7E:
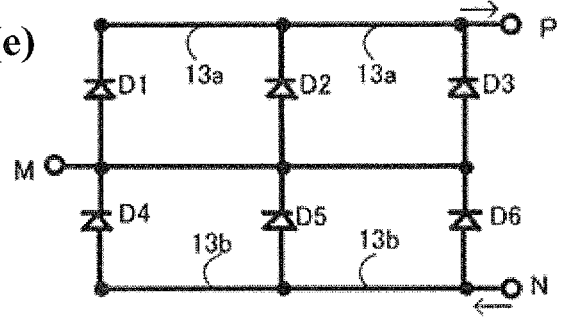

FIGS. 5(a), 5(b) are diagrams showing a relationship between the thermal resistance Rth1 and the filled rate of the first via 12a, calculated using the structure in FIGS. 3(a)-3(c), wherein FIG. 5(a) illustrates a state in which the thickness of the insulating plate 8a of the printed circuit board 8 is thin, and FIG. 5(b) illustrates a state in which the thickness of the insulating plate 8a of the printed circuit board 8 is set to be three times the thickness in FIG. 5(a). The filled rate is the rate of the area of the filled first via 12a to the area of the semiconductor chip expressed in percentage (%).

Also, herein, the chip size of the first semiconductor chip 6a and second semiconductor chip 6b is on the order of 5 mm, and the chip area is on the order of 25 $mm^2$. Also, the first via 12a and the second via 12b are filled with a Cu plating film, as previously described, and the first wiring layer 13a and the third wiring layer 13c are Cu plating films. The thermal conductivity of the insulating plate 8a of the printed circuit board 8 is as very low as on the order of $1/1000$ of the thermal conductivity of Cu, because of which the thermal resistance of a portion of the printed circuit board 8 other than the vias is high.

As the thermal resistance Rth2, not being by way of the vias, is constant at on the order of 0.5° C./W regardless of the filled rate.

Meanwhile, for the thermal resistance Rth1, it is not preferable that Rth1 rises significantly at a filled rate of 10% or less in both cases of FIG. 5(a) and FIG. 5(b). Therefore, it is desirable to set the filled rate to 10% or more.

The heretofore described result applies to the heat transfer to the first insulating substrate 4 from the second semiconductor chip 6b by way of the second via 12b. Therefore, it is also desirable that the filled rate of the second via 12b is 10% or more.

It is good to use a ceramic plate as the insulating plate 8a of the printed circuit board 8 because it is possible to reduce more thermal resistance than when using, for example, a glass epoxy plate. In this case, the vias only have to be formed by a method (for example, sputtering) other than plating.

FIGS. 6(a)-6(e) are transparent plan views of parts, viewed from above in a vertical direction, broken down by stacked parts. FIG. 6 (a) is a plan view of the first circuit plate 1a of the first insulating substrate 4, FIG. 6 (b) is a plan view of the first wiring layer 13a and fourth wiring layer 13d of the printed circuit board 8, FIG. 6 (c) is a plan view of the second wiring layer 13b and third wiring layer 13c of the printed circuit board 8, FIG. 6 (d) is a plan view of the second circuit plate 1b and third circuit plate 1c of the second insulating substrate 5, and FIG. 6 (e) is a circuit diagram. The circuit diagram is a diagram of a diode module wherein diodes form three phase bridges (a converter circuit). In the drawings, the direction of a current becomes opposite in the B portion, thus enabling wiring inductance to be small.

FIGS. 7(a)-7(e) are diagrams in which the wiring layers on the two opposite surfaces of the printed circuit board 8 are changed.

As shown in FIGS. 7 (a)-7 (e), by changing the wiring layers on the two opposed surfaces of the printed circuit board 8, it is possible to easily arrange different electrical circuits. In FIGS. 7(a)-7(e), the direction of a current becomes opposite in the portion B, thus enabling the wiring inductance to be small.

Also, the heretofore described diode module can easily be changed to an IGBT module or the like.

The semiconductor module 100 of the first embodiment is formed such that it is possible to eliminate components (aluminum wires, a resin case, a gel, and the like) forming a heretofore known semiconductor module 500, and thus possible to reduce cost. Also, by dividing a plurality of semiconductor chips into two groups and disposing one group on either surface of the printed circuit board 8, it is possible to achieve a reduction in the size of the semiconductor module.

Also, it is possible to reduce the wiring inductance by orienting the current directions of the first circuit plate 1a, second circuit plate 1b, and third circuit plate 1c against the current directions of their respective opposite wiring layers of the printed circuit board 8. Furthermore, it is possible to reduce the wiring inductance by orienting the current directions of the wiring layers on one surface of the printed circuit substrate 8 against the current directions of the wiring layers on the other surface, as shown in FIGS. 6 (a)-6 (e) and 7 (a)-7 (e). This is the effect of mutual induction generated between the plates and the layers and between the layers.

Also, by disposing the first insulating substrate 4, the first metal plate 2a of the first insulating plate 4 functions as a shield against radiated electromagnetic noise, and it is possible to reduce electromagnetic noise radiated upward from the first semiconductor chip 6a, the second semiconductor chip 6b, or the like.

Also, by disposing the first via 12a and first heat release member 16a, it is possible to efficiently double-sided cool the heat generated from the first semiconductor chip 6a. In the same way, by disposing the second via 12b and second heat release member 16b, it is possible to efficiently double-sided cool the heat generated from the second semiconductor chip 6b.

FIG. 8 is a sectional view when the first heat release member 16a is replaced with a high thermal conductive insulator 18 as a modified example of the first embodiment. By so doing, there is no more need to electrically separate the second circuit plate 1b and third circuit plate 1c, and it is possible to integrate the second circuit plate 1b and third circuit plate 1c, meaning that it is possible to reduce a distance L. As a result of this, it is possible to further reduce the size of the semiconductor module.

The semiconductor module 100 of the first embodiment is formed such that no cooling fin is installed on the upper first insulating substrate 4, but when the first metal plate 2a is sealed so as to be exposed, cooling fins can also be installed. By so doing, the efficiency of double-sided cooling from the semiconductor chips is further improved. In this case, as the creepage distance from the external terminals 9 decreases, it is only necessary to devise a way of, for example, covering the basal surfaces of the external terminals 9 with an insulating layer, or inserting the external terminals 9 in insulating tubes.

FIGS. 9(a) to 14 show a method of manufacturing a semiconductor module 100 according to a second embodiment. In FIG. 9(a) to FIG. 9(d), the left column is a process relating to the first insulating substrate 4, and the right column is a process relating to the second insulating substrate 5.

Firstly, a metal mask 30 is placed on each of the first insulating substrate 4 and second insulating substrate 5 (FIG. 9(a)).

Next, a solder paste 7a which is solidified into the joining material 7 is applied on the metal mask 30 (FIG. 9(b)).

Next, when the metal mask 30 is removed, the solder paste 7a is placed on each of the first circuit plate 1a and second circuit plate 1b (FIG. 9(c)).

Next, the first semiconductor chip 6a and the second semiconductor chip 6b are placed on the respective solder plates 7a, and the solder pastes 7a are solidified by being treated in an unshown reflow furnace (FIG. 9(d)).

Figure 10A:
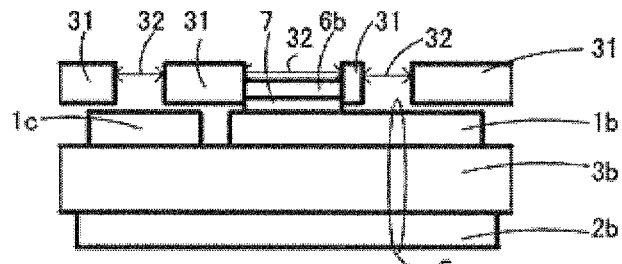
FIGS. 10(a)-10(f) are sectional views following FIG. 9(d) and illustrating a manufacturing process of the semiconductor module 100 according to the second embodiment.

Next, a metal mask 31 is placed on the second insulating substrate 5 (FIG. 10(a)). Opening portions 32 of the metal mask 31 are formed in a portion to position the second semiconductor chip 6b and in portions to dispose the first heat release member 16a and the solder paste 7a which forms the conductor 17.

Figure 10B:
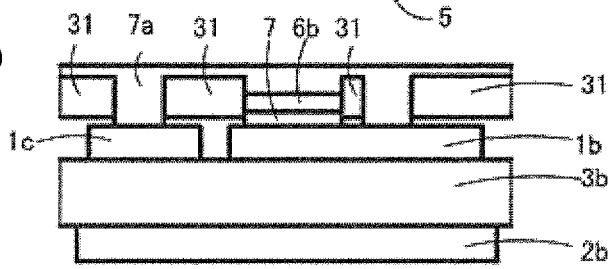

Next, a solder paste 7a is applied on the metal mask 31 (FIG. 10(b)).

Figure 10C:
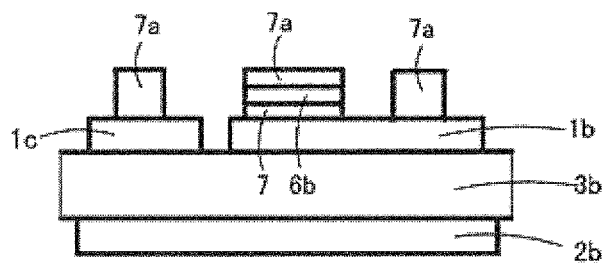

Next, when the metal mask 31 is removed, the solder paste 7a is placed on each of the second circuit plate 1b and third circuit plate 1c (FIG. 10(c)).

Figure 10D:
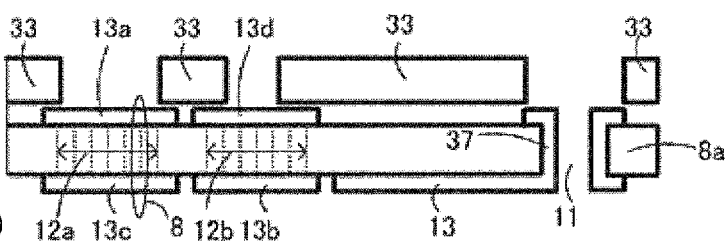

Next, a metal mask 33 is placed on the principal surface of the printed circuit board 8 (FIG. 10(d)). The through via 11 into which to insert the external terminal 9 is formed in an end portion of the printed circuit board 8, and a metal layer 37 is formed on the sidewall of the through via 11. Also, the first via 12a and the second via 12b are already formed in the printed circuit board 8.

Figure 10E:
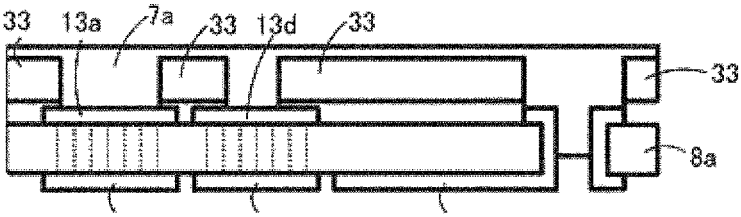
Figure 10F:
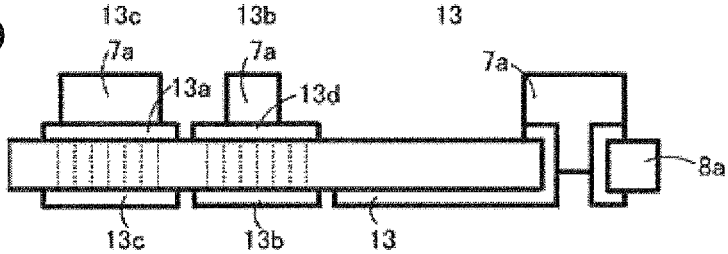

Next, a solder paste 7a is applied on the metal mask 33 (FIG. 10(e)).

Next, when the metal mask 33 is removed, the solder pastes 7a are placed on the principal surface of the printed circuit board 8.

In the heretofore described solder printing step, a solder paste may be applied using a dispenser or the like.

Figure 11A:
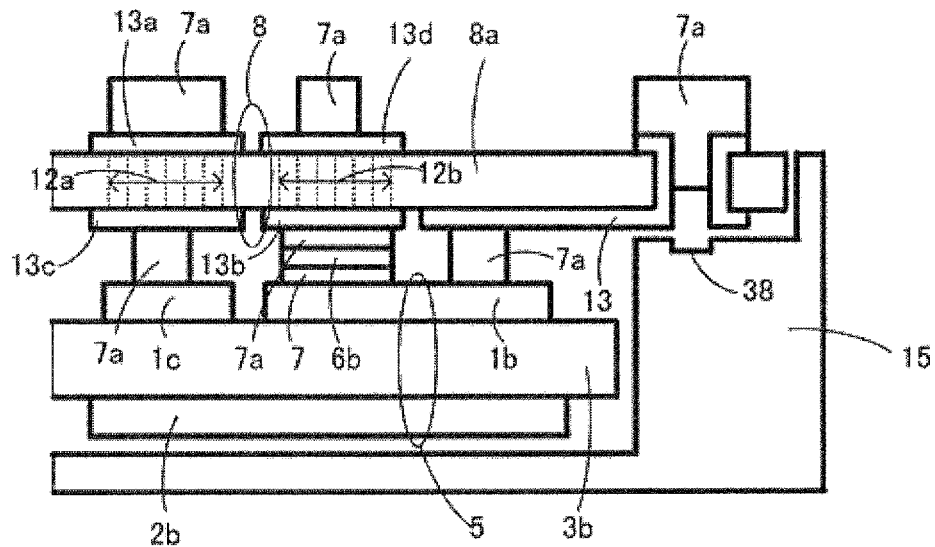
FIGS. 11(a), 11(b) are sectional views following FIG. 10(f) and illustrating a manufacturing process of the semiconductor module 100 according to the second embodiment.
Figure 11B:
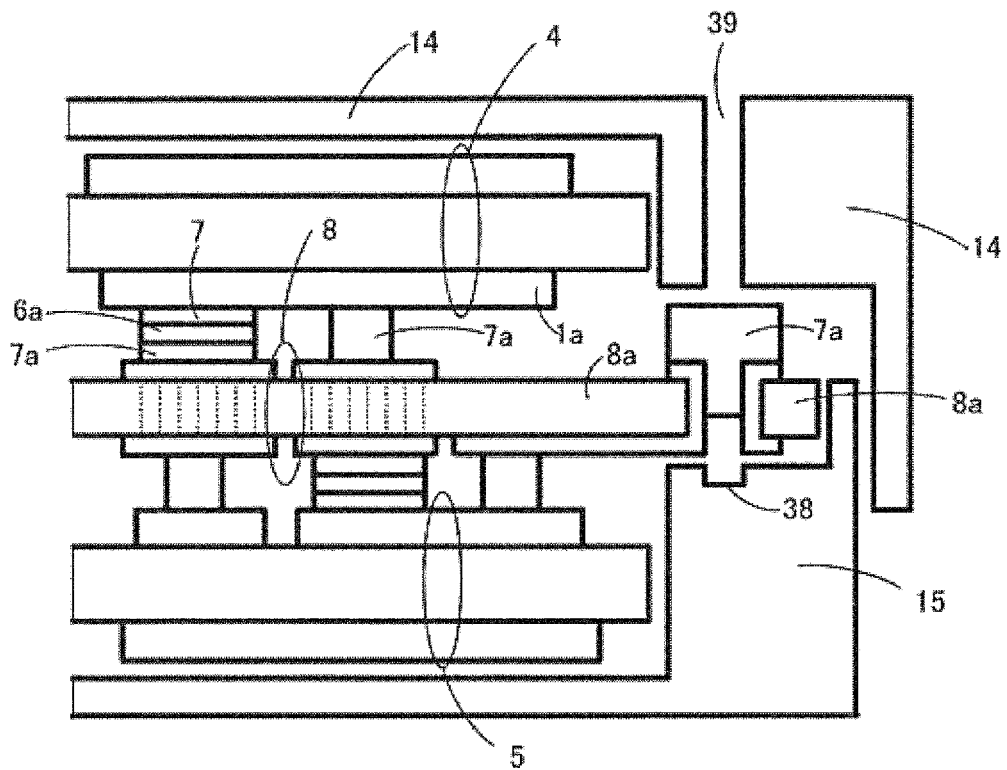

Next, the printed circuit board 8 is placed on the second insulating substrate 5 fixed by a fixing jig 15 (FIG. 11(a)). A concave portion 38 into which to insert the external terminal 9 is disposed on the fixing jig 15.

Next, the first insulating substrate 4 is placed, with the first circuit plate 1a downward, on the principal surface of the printed circuit board 8. Furthermore, a fixing jig 14 with which to fix the first insulating substrate 4 is placed on the first insulating substrate 4 (FIG. 11(b)). The fixing jig 14 and fixing jig 15 are formed from a material, such as a carbon ceramic material, which has a low linear expansion coefficient and to which no solder adheres. Also, the fixing jig 14 and the fixing jig 15 are processed so that the first insulating substrate 4, the second insulating substrate 5, the printed circuit board 8, and the like are placed in position. Also, a through hole 39 to insert the external terminal 9 is provided in the fixing jig 14. Also, the lower end of the external terminal 9 is fixed in a position higher than the second metal plate 2b in order to secure the ground insulation distance.

Figure 12:
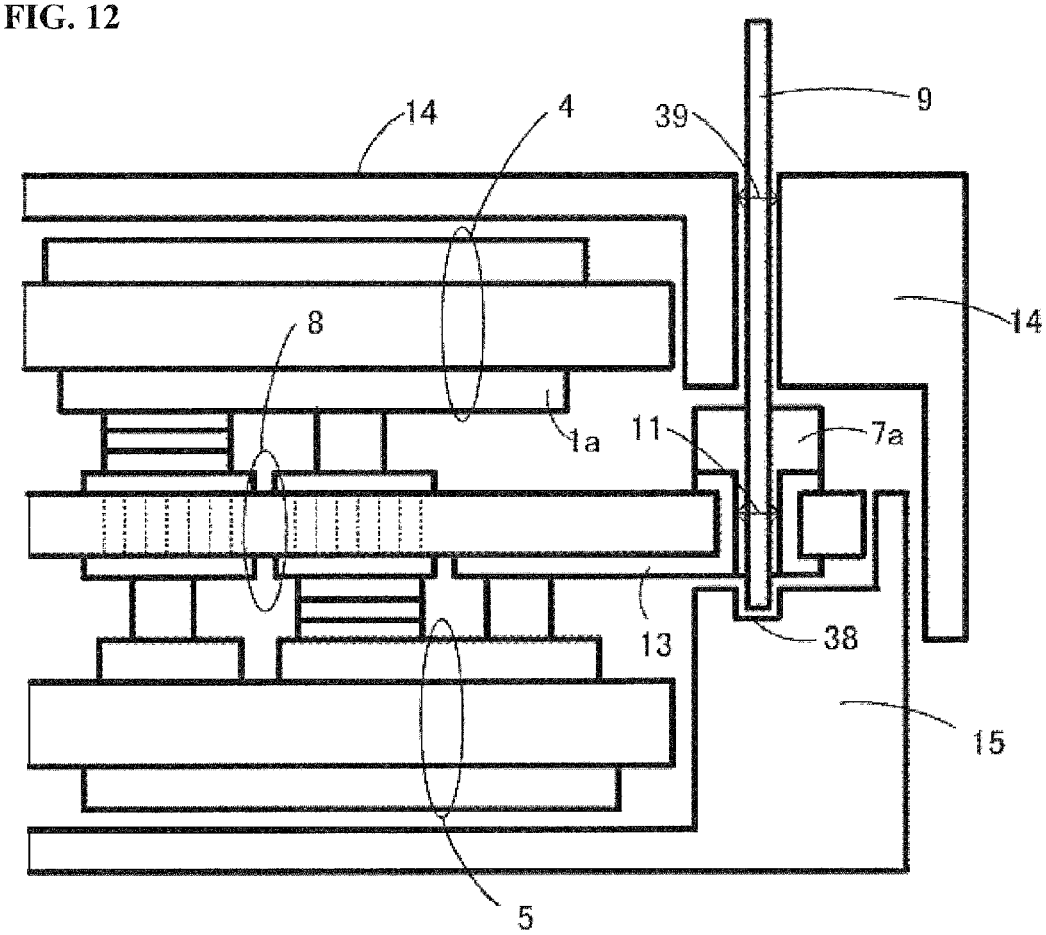
FIG. 12 is a sectional view following FIG. 11(b) and illustrating a manufacturing process of the semiconductor module 100 according to the second embodiment.

Next, the columnar external terminal 9 is inserted into the through hole 39 (FIG. 12). The external terminal 9 is disposed passing through the through via 11 in which the solder paste 7a is placed.

Next, the solder paste 7a is solidified by treating these members in the unshown reflow furnace, and soldering of the individual members is carried out at the same time. Subsequently, the fixing jig 14 and the fixing jig 15 are removed, thus completing a structure 34 in which the individual members are soldered (FIG. 13(a)).

Figure 13A:
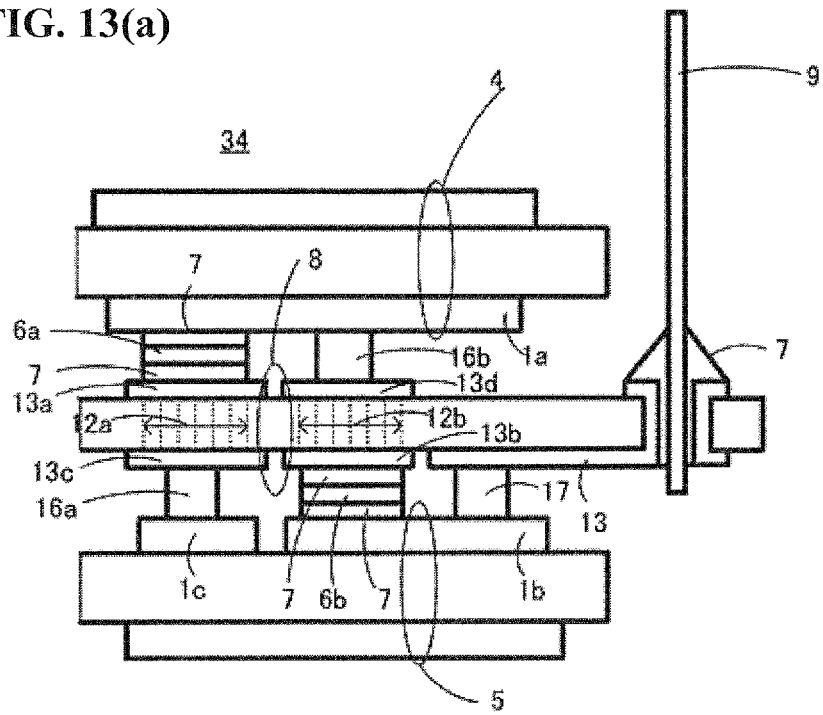
FIGS. 13(a), 13(b) are sectional views following FIG. 12 and illustrating a manufacturing process of the semiconductor module 100 according to the second embodiment.
Figure 13B:
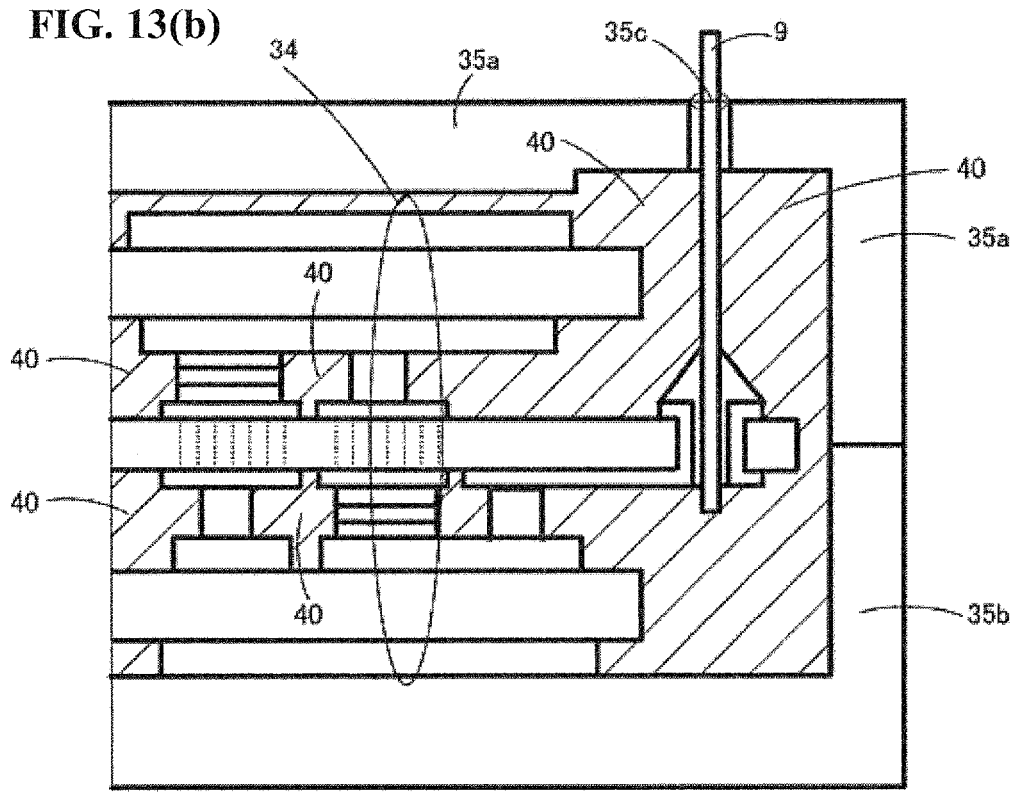

Next, the structure 34 is fixed in a casting jig 35b, and furthermore, is covered with a casting jig 35a, and a thermosetting resin 40 is injected into the inner portions of the casting jigs 35a and 35b (FIG. 13(b)). A through hole 35c through which to pass the external terminal 9 is provided in the casting jig 35a.

Figure 14:
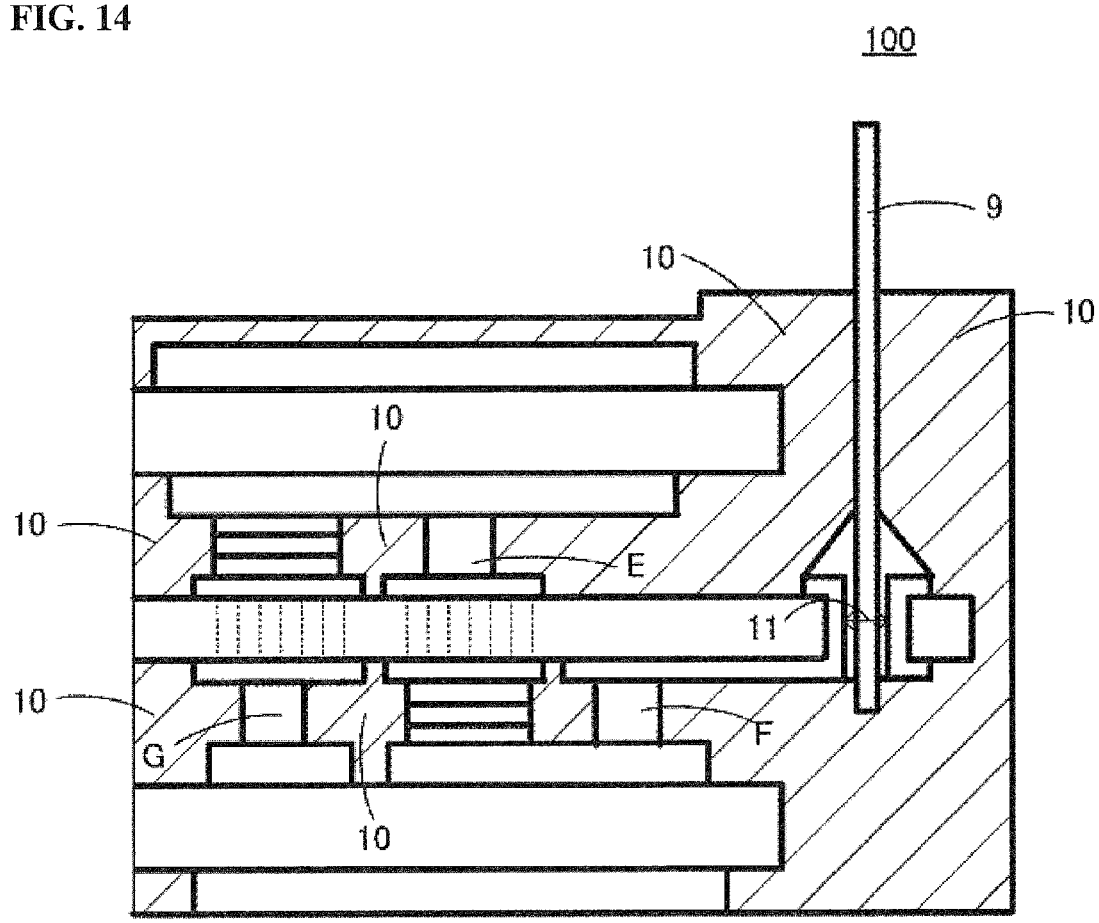
FIG. 14 is a sectional view following FIG. 13(b) and illustrating a manufacturing process of the semiconductor module 100 according to the second embodiment.

Next, the thermosetting resin 40 is cured into the sealing resin 10. Furthermore, the structure 34 covered with the sealing resin 10 is taken out from the casting jigs 35a and 35b, thus completing the semiconductor module 100 (FIG. 14).

In this way, main steps which assemble the semiconductor module 100 according to the second embodiment are the following three steps.

(1) A step of firmly attaching the first semiconductor chip 6a and second semiconductor chip 6b to the first insulating substrate 4 and second insulating substrate 5.

(2) A step of firmly attaching the printed circuit board 8, the first insulating substrate 4 and second insulating substrate 5 disposed on the two respective opposed surfaces of the printed circuit board 8, and the external terminal 9 at the same time using the solder paste 7a.

(3) A step of covering with the sealing resin 10.

Therefore, it is possible to reduce the time of an assembly step using batch processing, and thus possible to reduce manufacturing cost.

Next, a description will be given of one example of a method of forming the first via 12a. The second via 12b can be formed by the same method.

Figure 15A:
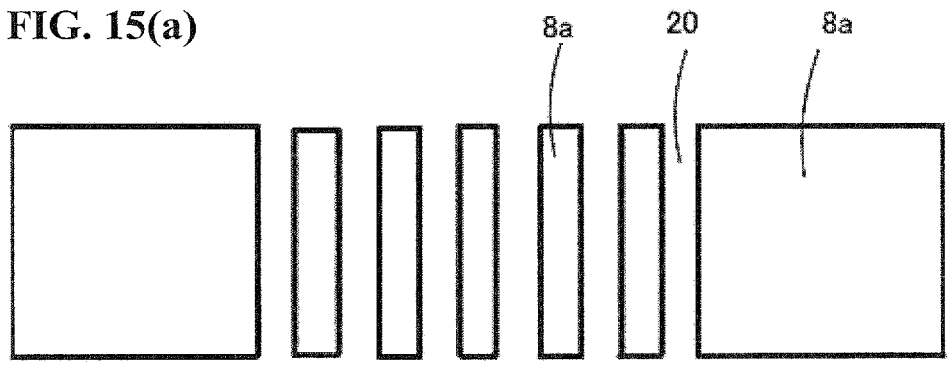
FIGS. 15(a)-15(c) are process diagrams illustrating a process of forming a via.
Figure 15B:
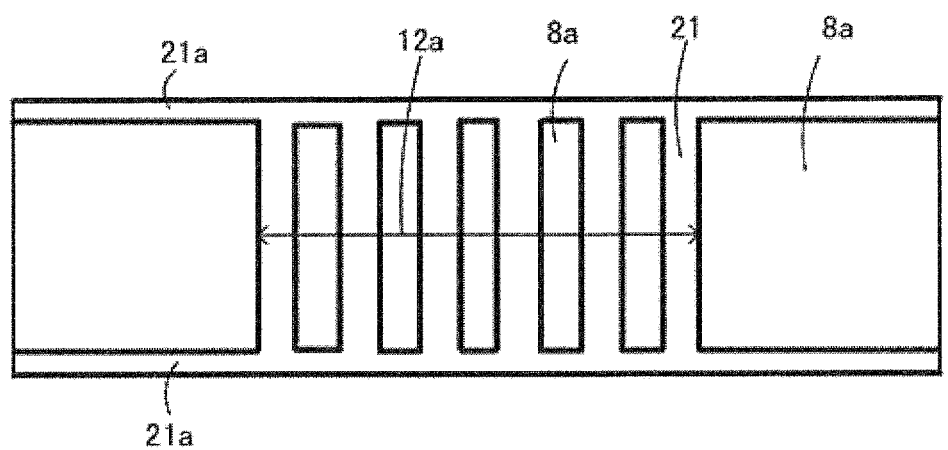
Figure 15C:
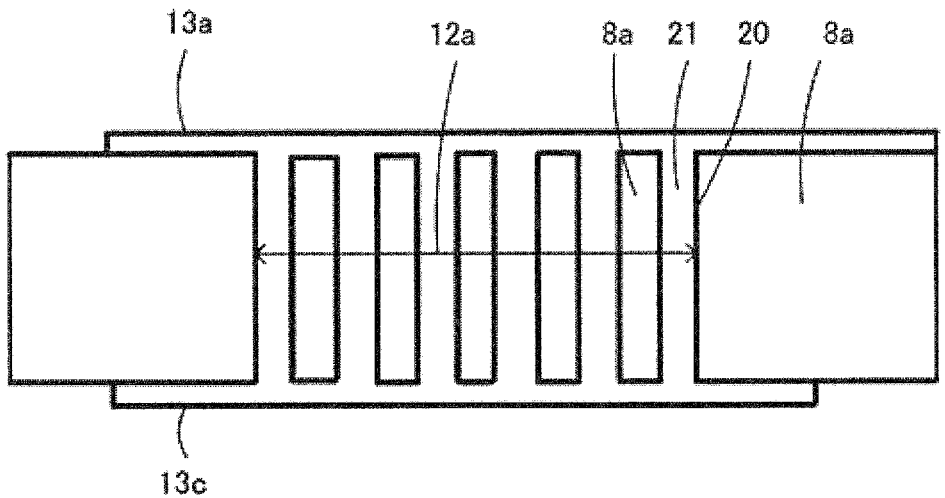
Figure 16:
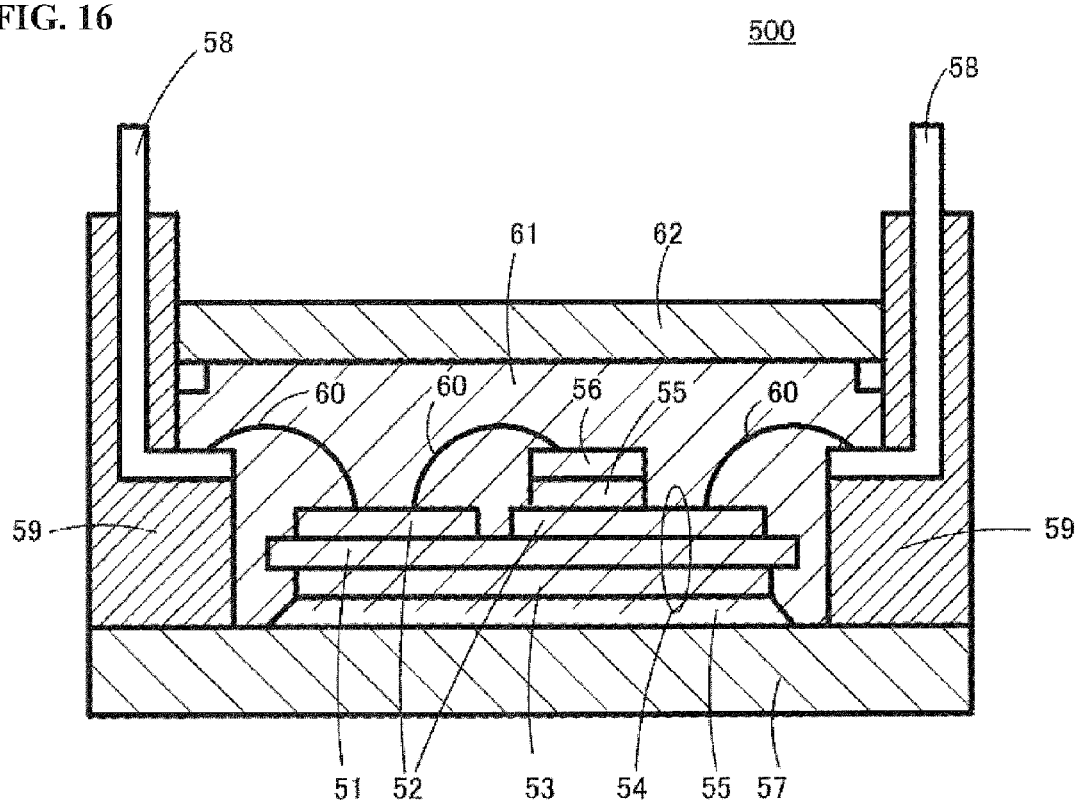
FIG. 16 is a structural diagram of a heretofore known semiconductor module 500.

FIGS. 15(a)-15(c) are process diagrams illustrating a step of forming the first via 12a.

Firstly, a large number of minute through holes 20 are formed in the insulating plate 8a of the printed circuit board 8 (FIG. 15(a)). The diameter of the through holes 20 is set to be twice or less the thickness of the first wiring layer 13a.

Next, Cu plating films 21a are formed on the two respective opposed surfaces of the insulating plate 8a by plate processing. At this time, by setting the diameter of the through holes 20 to be twice or less the thickness of the Cu plating films 21a, that is, the thickness of the first wiring layer 13a, the Cu plating films 21a formed on the sidewalls of the through holes 20 contact each other in the inner portions of the through holes 20 (FIG. 15(b)). The insides of the through holes 20 are filled with the Cu plating films 21a by the contact, thus forming the conductors 21. The aggregation of the conductors 21 is the first via 12a.

Next, the Cu plating films 21a on the two respective opposed surfaces of the insulating plate 8a are patterned by a photolithography technique, thus forming the first wiring layer 13a and third wiring layer 13c (FIG. 15(c)).

The first via 12a electrically and mechanically connected to the first wiring layer 13a and third wiring layer 13c is formed by these steps.

The case in which the first via 12a is formed by a plating method is illustrated here, but it is also possible to form the first via 12a using a sputtering method, a deposition method, or the like.

In the above, a description has been given, using the drawings, of the embodiment of the semiconductor module of the invention, but the semiconductor module of the invention, not being limited to the descriptions of the embodiment and drawings, can be modified in many ways without departing from the spirit of the embodiment.

REFERENCE SIGNS LIST

1a First circuit plate
1b Second circuit plate
1c Third circuit plate
2a First metal plate
2b Second metal plate
3a First ceramic plate
3b Second ceramic plate
4 First insulating substrate
5 Second insulating substrate
6a First semiconductor chip
6b Second semiconductor chip
7 Joining material
7a Solder paste
8 Printed circuit board
8a Insulating plate
9 External terminal
10 Sealing resin
11 Through via
12a First via
12b Second via
13 Wiring layer
13a First wiring layer
13b Second wiring layer
13c Third wiring layer
13d Fourth wiring layer
14, 15 Fixing jig
16a First heat release member
16b Second heat release member
17 Conductor
18 High thermal conductive insulator
20 Through hole
21 Conductor 21a Cu plating film
30, 31, 33 Metal mask
32 Opening portion
34 Structure
35a, 35b Casting jig
37 Metal layer
38 Concave portion
39 Through hole
40 Thermosetting resin
100 Semiconductor module

What is claimed is:

1. A semiconductor module, comprising:
a printed circuit board having
an insulating plate,
a first wiring layer and a fourth wiring layer disposed on a principal surface of the insulating plate,
a second wiring layer and a third wiring layer disposed on a surface opposite to the principal surface,
a first via disposed in the insulating plate, and electrically and mechanically connected to the first wiring layer and third wiring layer, and
a second via disposed in the insulating plate, and electrically and mechanically connected to the second wiring layer and the fourth wiring layer;
a first insulating substrate disposed facing the first wiring layer, and having a first circuit plate on a surface facing the first wiring layer and the fourth wiring layer;
a second insulating substrate disposed facing the second wiring layer, and having a second circuit plate facing the second wiring layer and a third circuit plate facing the third wiring layer;
a first semiconductor chip sandwiched between the first wiring layer and the first circuit plate, and having a conductive joining material on two surfaces to fix to the first wiring layer and the first circuit plate;
a second semiconductor chip sandwiched between the second wiring layer and the second circuit plate, and having a conductive joining material on two surfaces to fix to the second wiring layer and second circuit plate;
a first heat release member sandwiched and fixed between the third wiring layer and the third circuit plate; and
a second heat release member sandwiched and fixed between the fourth wiring layer and the first circuit plate.

2. The semiconductor module according to claim 1, wherein the first via on the insulating plate has an area of 10% or more relative to an area of the first semiconductor chip.

3. The semiconductor module according to claim 1, wherein the second via on the insulating plate has an area of 10% or more relative to an area of the second semiconductor chip.

4. The semiconductor module according to claim 1, wherein the first heat release member and the second heat release member are a conductive joining material or a metal plate.

5. The semiconductor module according to claim 1, wherein the second circuit plate and the third circuit plate are integrally formed, and the first heat release member is formed from a high thermal conductive insulator.

6. The semiconductor module according to claim 1, further comprising a metal plate disposed on a surface, of the second insulating substrate, opposite to a surface disposed with the second circuit plate.

7. The semiconductor module according to claim 1, further comprising a metal plate disposed on a surface, of the first insulating substrate, opposite to the surface disposed with the first circuit plate.

8. The semiconductor module according to claim 1, wherein the first via and the second via are columnar conductors filled inside each of a plurality of through holes disposed in the insulating plate of the printed circuit board.

9. The semiconductor module according to claim 1, wherein each of the joining materials and heat release members is a solder.

10. The semiconductor module according to claim 1, further comprising an external terminal electrically connected to the first wiring layer or second wiring layer.

* * * * *

UNITED STATES PATENT AND TRADEMARK OFFICE
CERTIFICATE OF CORRECTION

PATENT NO. : 9,530,707 B2  
APPLICATION NO. : 14/877389  
DATED : December 27, 2016  
INVENTOR(S) : Takahito Harada Page 1 of 1

It is certified that error appears in the above-identified patent and that said Letters Patent is hereby corrected as shown below:

In the Specification

Please change Column 6, Line 24, from "... substrate 5 byway ..." to --... substrate 5 by way ...--.

Signed and Sealed this  
Second Day of May, 2017

Michelle K. Lee  
*Director of the United States Patent and Trademark Office*